(12) United States Patent
Lund et al.

(10) Patent No.: US 6,668,844 B2
(45) Date of Patent: *Dec. 30, 2003

(54) SYSTEMS AND METHODS FOR PROCESSING WORKPIECES

(75) Inventors: Eric Lund, Kent, WA (US); Joe Lanfrankie, Kent, WA (US); Gil Lund, Kent, WA (US); Dana Scranton, Kalispell, MT (US); Eric Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 70 days.

This patent is subject to a terminal disclaimer.

(21) Appl. No.: 09/907,544

(22) Filed: Jul. 16, 2001

(65) Prior Publication Data

US 2003/0010362 A1 Jan. 16, 2003

(51) Int. Cl.[7] .................................. B08B 3/00
(52) U.S. Cl. .................... 134/155; 134/30; 134/33; 134/99.1; 134/186; 134/137; 134/902; 34/165; 34/279; 34/288; 34/397; 34/444
(58) Field of Search ................ 134/30, 33, 155, 134/99.1, 186, 902, 137; 34/444, 279, 288, 397, 165

(56) References Cited

U.S. PATENT DOCUMENTS

| | | |
|---|---|---|
| 3,943,637 A | 3/1976 | Hanser |
| 4,318,749 A | 3/1982 | Mayer |
| 4,813,154 A | 3/1989 | Ronning |
| 5,074,057 A | 12/1991 | Kanai |
| 5,230,163 A | 7/1993 | Lease |
| 5,271,165 A | 12/1993 | Nguyen |
| 5,287,633 A | 2/1994 | Sachs |
| 5,513,446 A | 5/1996 | Neubauer et al. |
| 5,660,517 A | 8/1997 | Thompson et al. |
| 5,664,337 A | 9/1997 | Davis et al. |
| 5,740,617 A | 4/1998 | Rittenhouse |
| 6,076,279 A | 6/2000 | Saalasti |
| 6,346,126 B1 | 2/2002 | Chao et al. |

FOREIGN PATENT DOCUMENTS

WO    WO 00/02675 A1    1/2000

Primary Examiner—Randy Gulakowski
Assistant Examiner—Gentle E. Winter
(74) Attorney, Agent, or Firm—Perkins Coie LLP

(57) ABSTRACT

Workpieces requiring low levels of contamination, such as semiconductor wafers, are loaded into a rotor within a process chamber. The process chamber has a horizontal drain opening in its cylindrical wall. The chamber is closed via a door. A process or rinsing liquid is introduced into the chamber. The liquid rises to a level so that the workpieces are immersed in the liquid. The chamber slowly pivots or rotates to move the drain opening down to the level of the liquid. The liquid drains out through the drain opening. The drain opening is kept near the surface of the liquid to drain off liquid at a uniform rate. An organic solvent vapor is introduced above the liquid to help prevent droplets of liquid from remaining on the workpieces as the liquid drains off. The rotor spins the workpieces to help to remove any remaining droplets by centrifugal force.

18 Claims, 15 Drawing Sheets

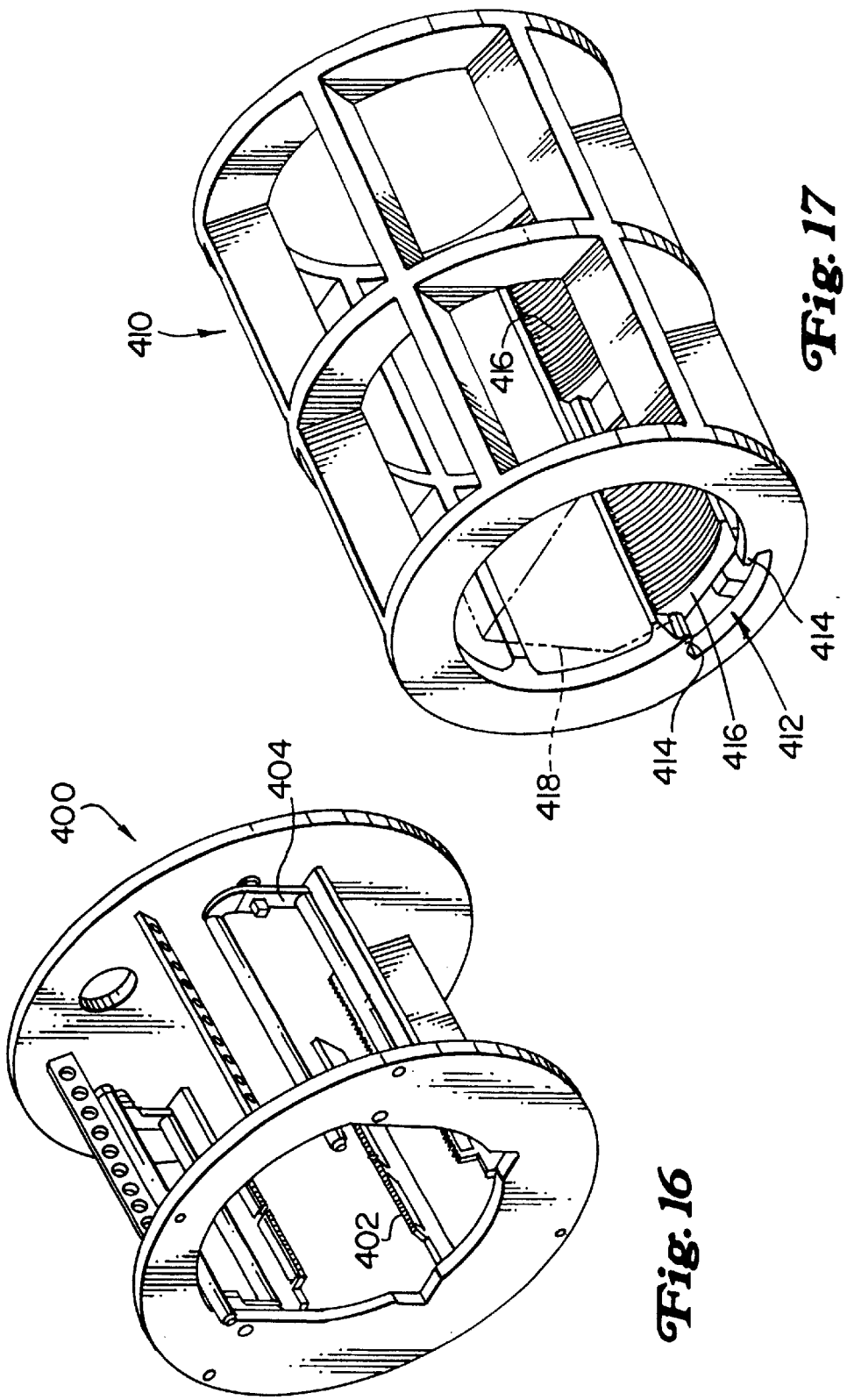

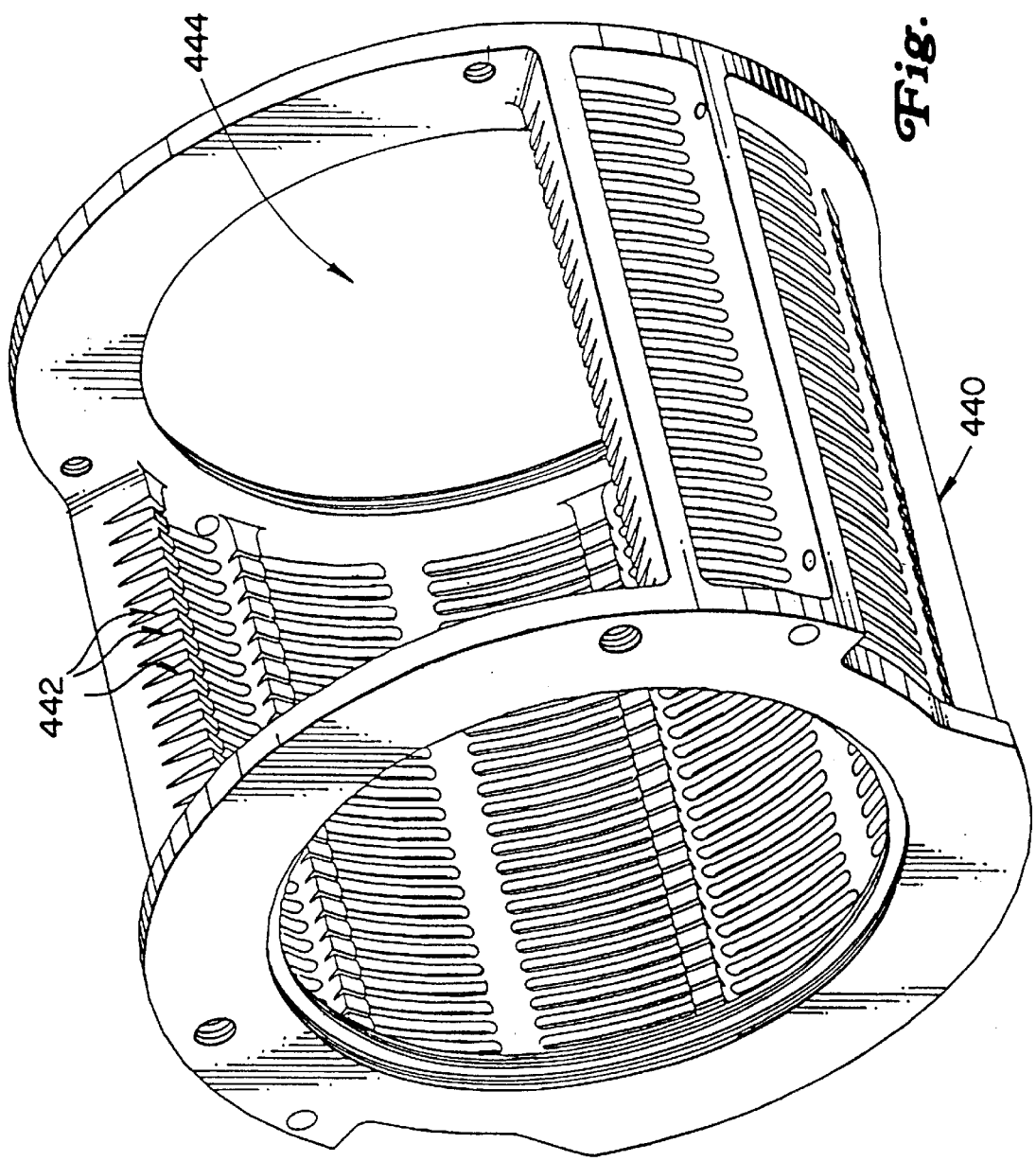

SYSTEMS AND METHODS FOR PROCESSING WORKPIECES

FIELD OF INVENTION

This Application incorporates by reference U.S. Pat. No. 6,427,359 and Published U.S. Patent Application No. 2003/0010352 A1, both filed on Jul. 16, 2001.

The invention relates to surface preparation, processing and cleaning of workpieces, such as semiconductor wafers, flat panel displays, rigid disk or optical media, thin film heads, or other workpieces formed from a substrate on which microelectronic circuits, data storage elements or layers, or micro-mechanical elements may be formed. These and similar articles are collectively referred to here as a "workpiece".

BACKGROUND OF THE INVENTION

Surface preparation, such as cleaning, etching, and stripping, is an essential and important element of the manufacturing process for semiconductor wafers and similar workpieces. Surface preparation steps are commonly performed, using liquid corrosive, caustic, or solvent chemicals, or using vapor phase chemicals. Surface preparation of workpieces is performed to prepare or condition the surface for a subsequent process step.

Cleaning is a critical step in manufacturing semiconductors and similar products. Cleaning involves the use of chemical formulations to remove contaminants, such as oxides, particles, metals, or organic material, while maintaining the cleanliness and integrity of the surface of the workpiece. Some liquid, gas or vapor phase chemicals when applied to a workpiece, result in surface characteristics that are more susceptible to contamination than others. For example, application of hydrofluoric acid (HF) to the surface of a workpiece will remove oxide from the silicon surface, resulting in a surface that is active. Workpieces in general, and especially workpieces having an active surface, are constantly susceptible to contamination by airborne microscopic particles. Contamination can also occur in the cleaning process, when the liquid process media is removed from the surface of the workpiece.

Thus, to minimize contamination of the workpiece, it is advantageous to perform a sequence of surface preparation steps within a controlled environment, that preferably occupies a relatively small amount of fabrication facility space, and in which exposure to contamination sources is minimized. Accordingly, it is an object of the invention to provide improved surface processing methods and apparatus.

Cleaning workpieces while avoiding or minimizing contamination has long been an engineering challenge. Workpieces are often cleaned with a spray or bath of de-ionized water. The water is then removed, often in the presence of an organic solvent vapor, such as isopropyl alcohol, which lowers the surface tension of the water. This helps to prevent droplets of water from remaining on and contaminating the workpiece.

Various cleaning methods and systems and various rinsing and drying methods and apparatus have been proposed and used. In a typical system, wafers are immersed in a vessel. A mechanism is provided to hold the wafers. Another mechanism is provided to lift the wafers out of the liquid, by pushing them up from below. While this technique has been used, it can result in trapping of liquid in or around the spaces where the wafers contact the holding mechanism, resulting in increased contamination. It is also complicated by the need for the lifting mechanism. In an alternative system, the wafers are held in a fixed position while the liquid is drained away from below. This technique has less tendency for trapping liquid. However, as the liquid level drops, the solvent vapor above the liquid is absorbed by the liquid. Consequently, the top sections of the wafer are exposed to liquid which is different from the liquid at the bottom sections of the wafers. This potentially results in non-uniform processing. Accordingly, while these and other techniques have been used with varying degrees of success, there is still a great need for improved systems and methods for cleaning workpieces.

It is therefore also an object of the invention to provide an improved system and method for cleaning workpieces.

SUMMARY OF THE INVENTION

In a first aspect, surface preparation processes on workpieces are performed within a single chamber. The workpieces are contacted by process fluids by spraying or immersion. The workpieces may be processed and/or rinsed and dried within the single chamber. This minimizes exposure of the workpiece to contaminants and provides an improved application of process fluids or media to the workpiece.

In a second aspect, workpieces are held in a rotor. A process chamber around the rotor can pivot to move a drain outlet down to the level of the liquid contained in the chamber. The liquid then drains out of the chamber through the outlet. Rotating the workpieces within the process chamber allows process fluids to be more uniformly distributed over the work pieces, and also allows for removal of fluids via centrifugal force.

In a third aspect, openings or spray nozzles on or in the process chamber supply a fluid onto the workpieces.

In a fourth aspect, sonic energy, such as ultrasonic or megasonic energy, is applied to the workpiece, preferably through liquid in which the workpiece is immersed.

In a fifth aspect, a door frame is handed off from a door assembly when engaged onto the process chamber, to allow the door frame to pivot or rotate with the process chamber.

In a sixth aspect, the process chamber has a continuous cylindrical side wall including a drain opening or outlet. Liquid within the process chamber drains out through the drain opening, as the chamber is pivoted to bring the drain opening down to the level of the liquid in the chamber. The process chamber encloses the work pieces on all sides, to better control the process environment.

In a sixth aspect, unique methods for cleaning a workpiece is provided. These methods solve the problems of the known methods now used in the semiconductor manufacturing industry. Workpieces are held in a rotor within a process chamber having a drain outlet. The workpieces are immersed in liquid within the process chamber. Liquid is preferably continuously supplied into the chamber so that liquid is continuously overflowing and running out of the drain outlet. The process chamber is pivoted to move the drain outlet down in a controlled movement, to lower the level of liquid in the chamber. Liquid supply to the chamber and overflow at the liquid surface preferably continues as the chamber pivots and the liquid level drops. This process continues until the liquid level drops below the workpieces and the chamber is pivoted to drain virtually all liquid out of the chamber.

By maintaining the overflow at the liquid surface, and by maintaining a constant flow towards and out of the drain outlet, impurities at the liquid surface flow away from the workpieces, reducing potential for contamination. The liquid in the chamber remains uniform at all depths, as the surface of the liquid which the solvent vapor dissolves into, is constantly being replaced with fresh liquid. After the liquid is removed from the chamber, the workpieces are advantageously rotated. Liquid droplets remaining on the workpieces or adjacent components of the apparatus are centrifugally removed. Consequently, cleaning is provided with a uniform liquid bath and with reduced potential for trapped or residual liquid remaining on the workpieces. The disadvantages associated with the machines and methods currently in use, as described above, are overcome.

The aspects of the invention described above provide greatly improved processing and cleaning apparatus and methods. These aspects help to provide more reliable and efficient processing.

Further embodiments and modifications, variations and enhancements of the invention will become apparent. The invention resides as well in subcombinations of the features shown and described. Features shown in one embodiment may also be used in other embodiments as well.

BRIEF DESCRIPTION OF THE DRAWINGS

In the drawings, wherein the same reference number indicates the same element, throughout the several views:

FIG. 16 is a perspective view of a rotor for holding workpieces directly.

FIG. 17 is a perspective view of an alternative rotor for holding workpieces held within a tray, carrier, or cassette.

FIG. 19 is a perspective view of a carrier for holding workpieces directly, with the workpieces loaded and unloaded through a side wall, and with the carrier held in a rotor such as the rotor shown in FIG. 18.

DETAILED DESCRIPTION

A workpiece rotor holds workpieces, either directly, or by holding a carrier containing workpieces. A process chamber is provided around the rotor and is adapted, when closed, to hold a liquid. Liquid is provided into the process chamber, so that the workpieces are at least partially immersed. The process chamber pivots or rotates, causing a drain opening to move down to the level of the liquid. This allows liquid to move out of the process chamber. The process chamber continues to rotate until most or all liquid is removed from the chamber. Other steps and features described below may be advantageous, but are not necessarily essential to the invention.

Figure 1:
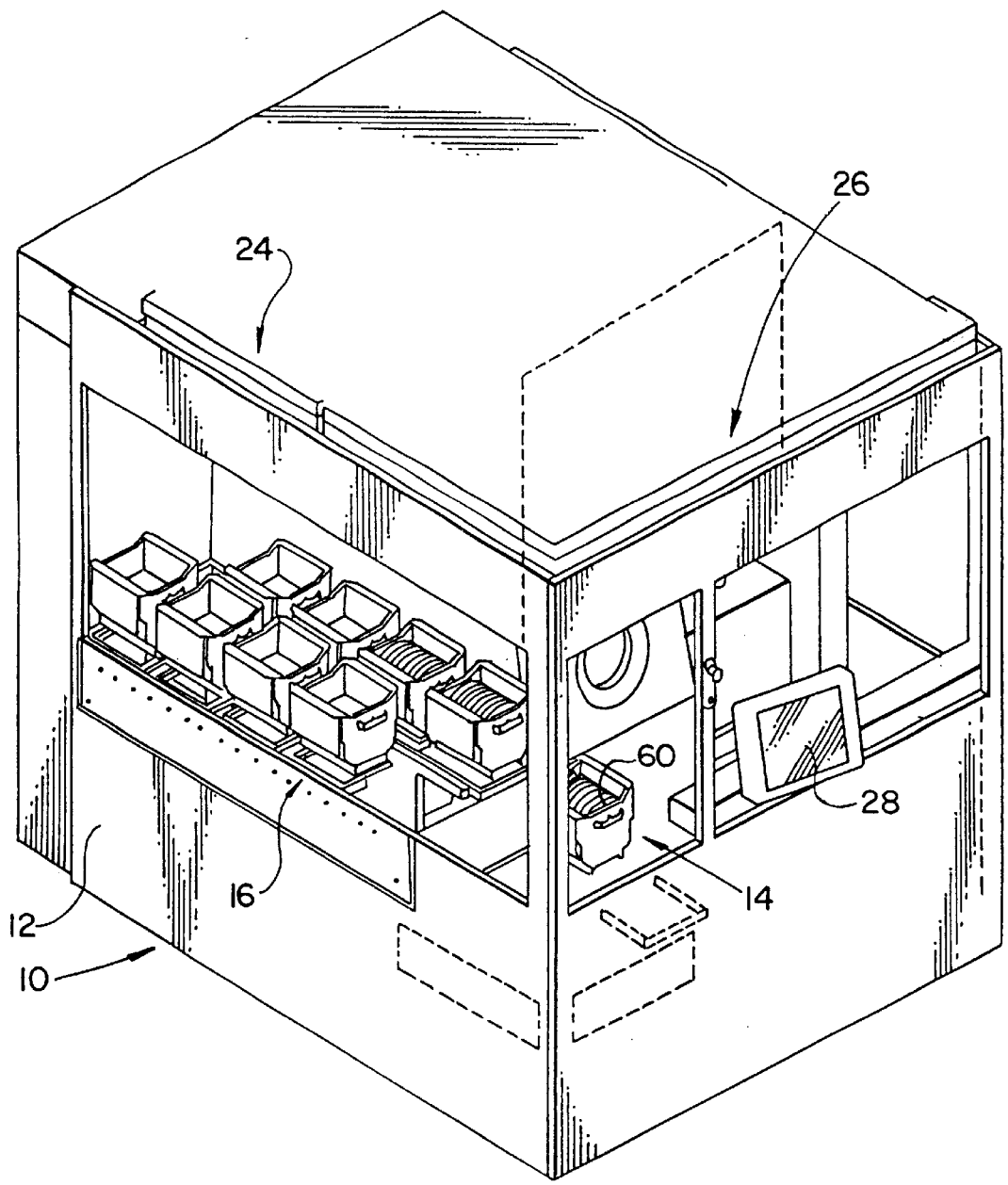
FIG. 1 is a perspective view of a system for processing workpieces.
Figure 2:
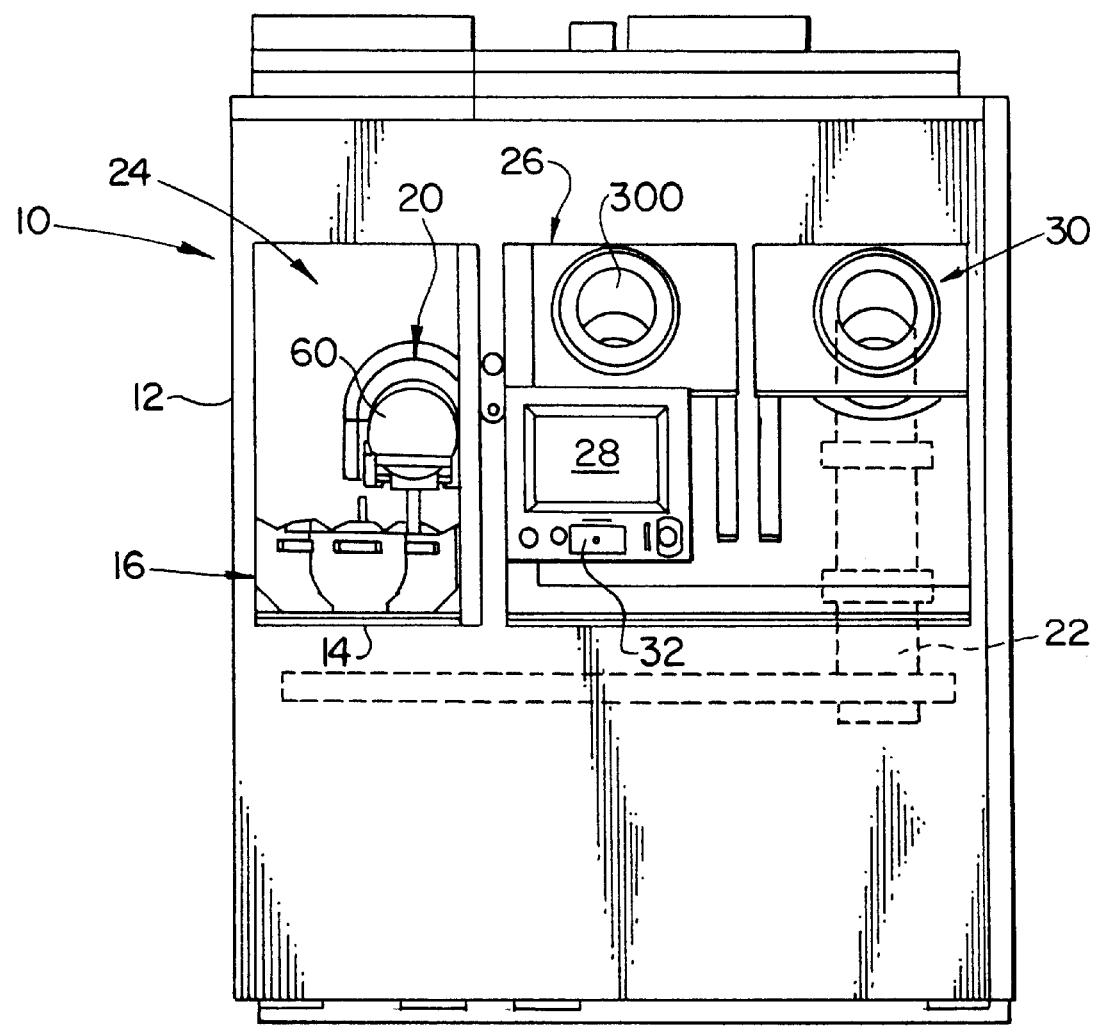
FIG. 2 is a front view of the system shown in FIG. 1.
Figure 3:
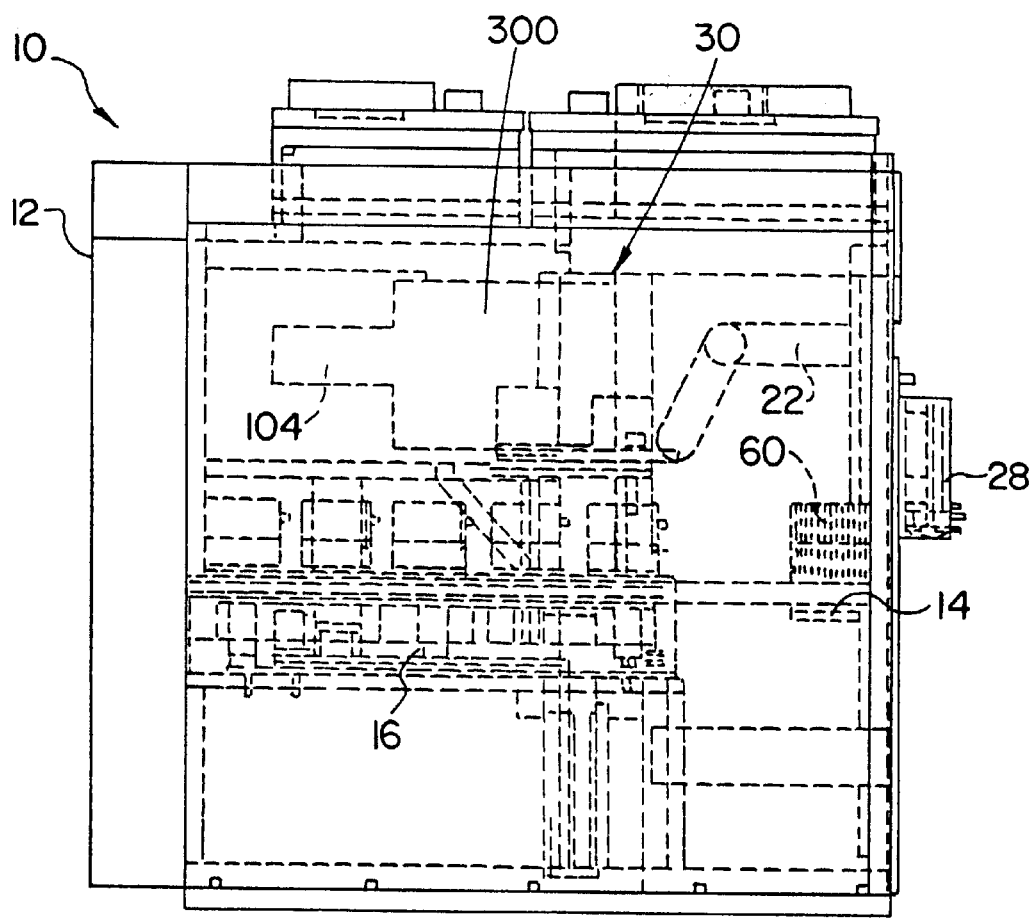
FIG. 3 is a side view of the system shown in FIG. 1.

As shown in FIGS. 1, 2 and 3, a workpiece processing system 10 preferably has an enclosure 12 to maintain and control clean air flow and reduce contamination of workpieces. An input/output station 14 at the front of the system 10 allows workpieces 60 to be loaded and unloaded from the system 10. An indexer 16, or other temporary workpiece storage is provided adjacent to the input/output station 14.

The system 10 is preferably divided into an interface section 24 and a process section 26. These sections may be separated by a partition having a door opening. The interface section 24 includes the input/output station 14 and the indexer 16 or other temporary workpiece storage. The process section 26 includes one or more process stations 30, with each process station 30 including a processor unit 50. The process station is separately shown in FIGS. 3B and 3C. The interface section 24 also includes a process robot 22 for moving workpieces to and from the indexer 16 and processor unit 50. A control panel 28 may be provided on the enclosure 12, to allow instructions or programming to be input into a computer controller 32 which controls the system 10.

The workpieces 60 may be provided in open carriers, cassettes or trays, and handled as described in U.S. Pat. No. 6,279,724, incorporated herein by reference. Alternatively, the workpieces 60 may be provided within sealed pods or containers which are unsealed at a docking station, as described in U.S. patent application Ser. No. 08/994,737 or 09/612,009, both incorporated herein by reference.

Figure 4:
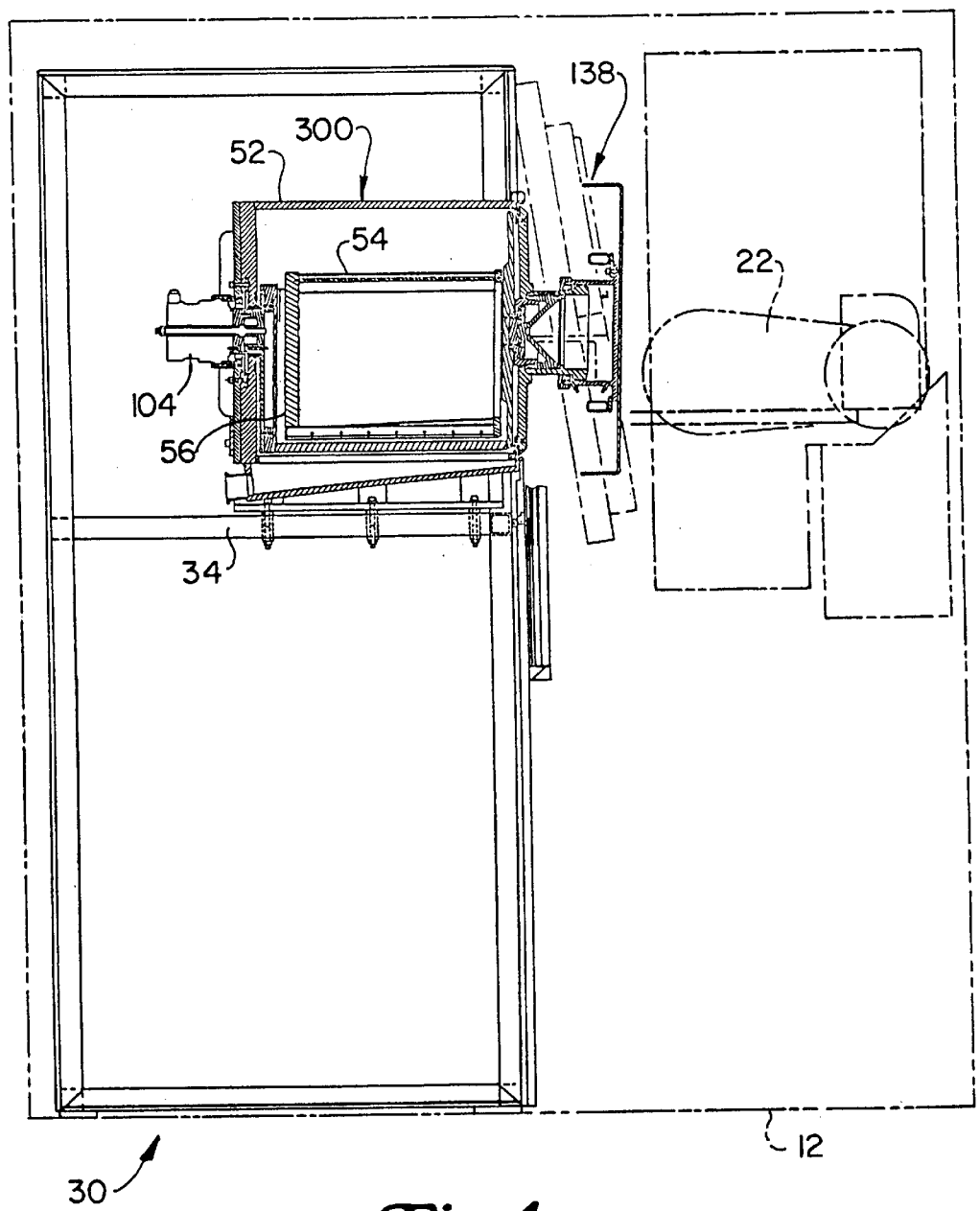
FIG. 4 is a side view of the process station shown in FIG. 2.
Figure 5:
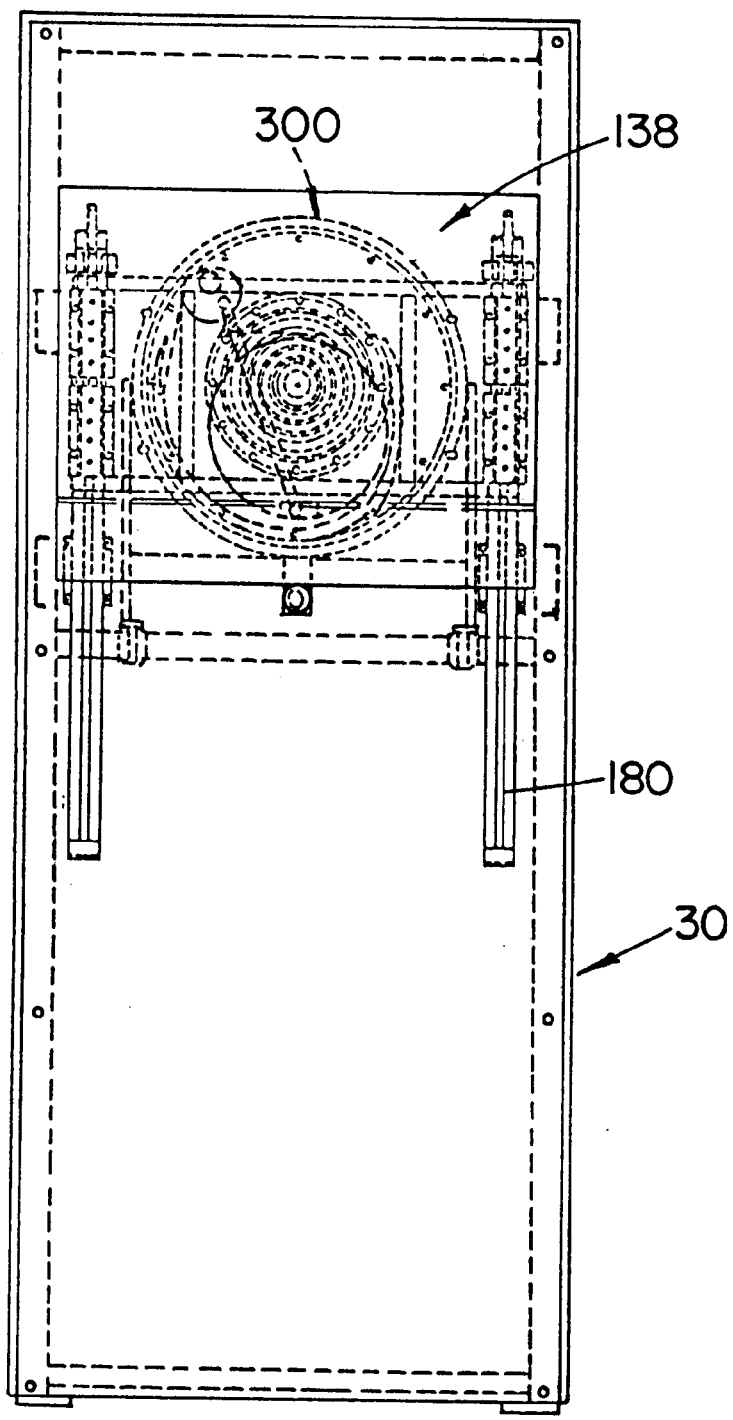
FIG. 5 is a front view of the process station shown in FIG. 3.

A processor unit 50 is shown in FIGS. 4 and 5. The processor unit 50 may be used in the automated system 10 shown in FIGS. 1–3, or in other automated systems, or as a stand alone unit.

Figure 6:
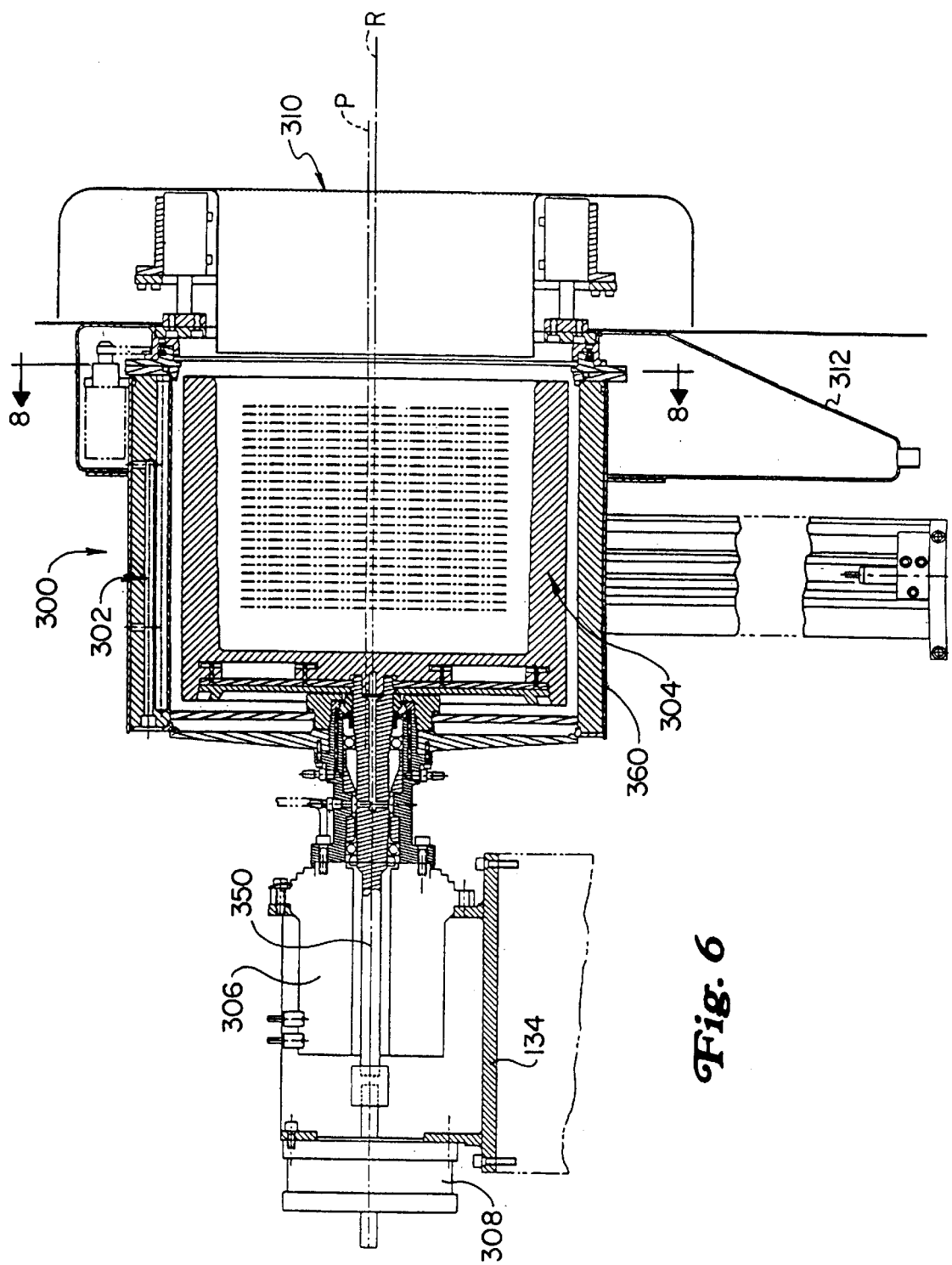
FIG. 6 is a section view of a processor unit having a rotor which spins within the process chamber.

Referring to FIG. 6, in an alternative processor unit 300, a rotor 304, or a rotatable workpiece support, is positioned within a process chamber 302. A pivot motor or actuator 306 is linked to the process chamber 302. The pivot motor 306 pivots the process chamber from a first position where the chamber can hold a liquid, to a second position where most or all liquid in the chamber runs out via gravity. The first position may be a 0° or upright position. The second position is generally from 60° up to about 180°, and typically about a 100°, 110° or 120° position from the first position. A spin motor 308 is connected to the rotor 304, to spin the rotor 304 within the process chamber 302. A door assembly 310 is disengaged from the process chamber 302, for loading and unloading workpieces. The door assembly 310 has a door frame engageable to the process chamber 302, to close off or seal off, the open front end of the process chamber 302, during processing. An overflow trough 312 is optionally positioned below the open front end of the process chamber 302, to collect any liquid released outside of the process chamber 302.

As certain process fluids are corrosive, the rotor 304 and process chamber 302 may be made of a corrosion-resistant material, such as Teflon fluorine-containing resins. Where Teflon is used, the rotor and process chamber may have relatively thick walls and sections to provide adequate strength. In addition, a metal chamber support 360 may be provided around the outside of the process chamber 302, as shown in FIG. 6, in a position where it is not exposed to process fluids. The support 360 strengthens the process chamber 302.

Figure 7:
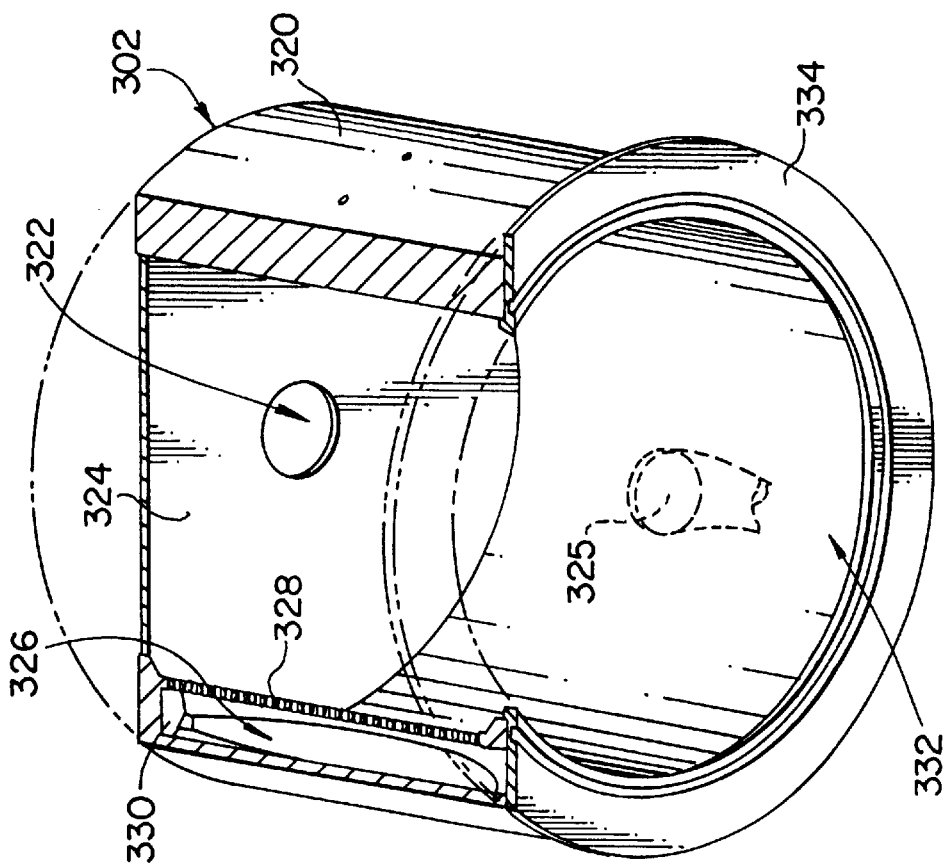
FIG. 7 is a cut away perspective view of the process chamber shown in FIG. 6.
Figure 10:
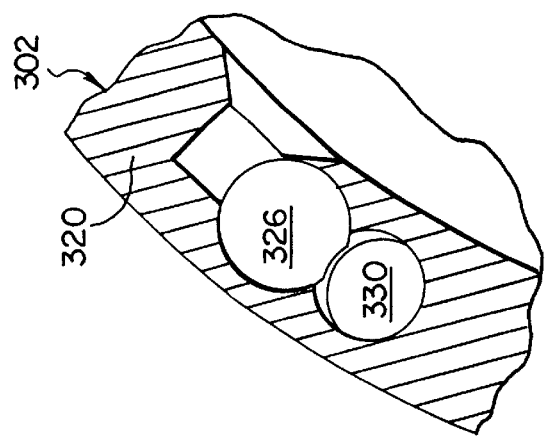
FIG. 10 is an enlarged section view of the drain slot in the cylindrical side wall of the process chamber shown in FIGS. 7 and 9.

Turning to FIG. 7, the process chamber 302 has a continuous preferably cylindrical side wall 320 joined to a rear wall 324. Consequently, when the open front end 332 of the process chamber 302 is closed off by a door frame, as described below, the process chamber 302 surrounds and encloses workpieces on all sides, during processing.

Figure 8:
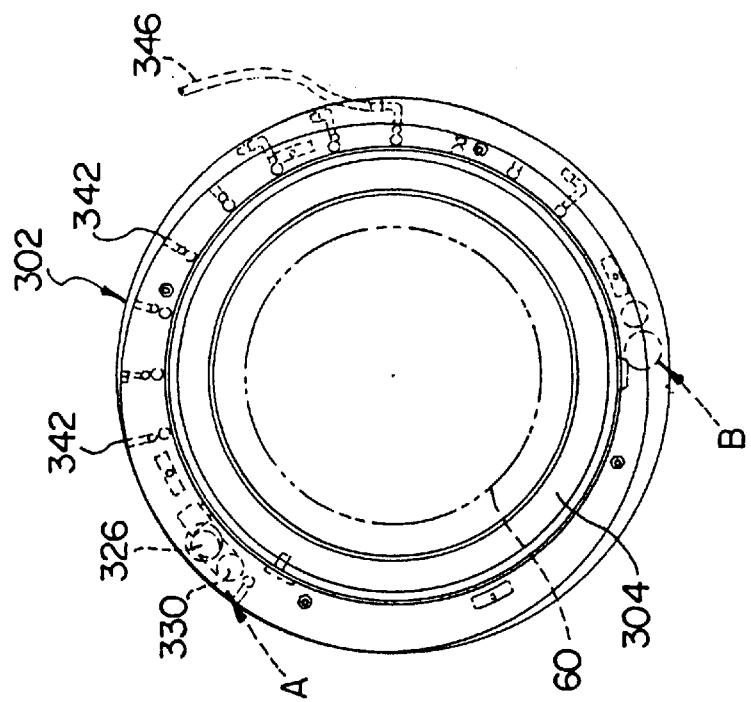
FIG. 8 is a partial section view taken along line 8—8 of FIG. 6.
Figure 9:
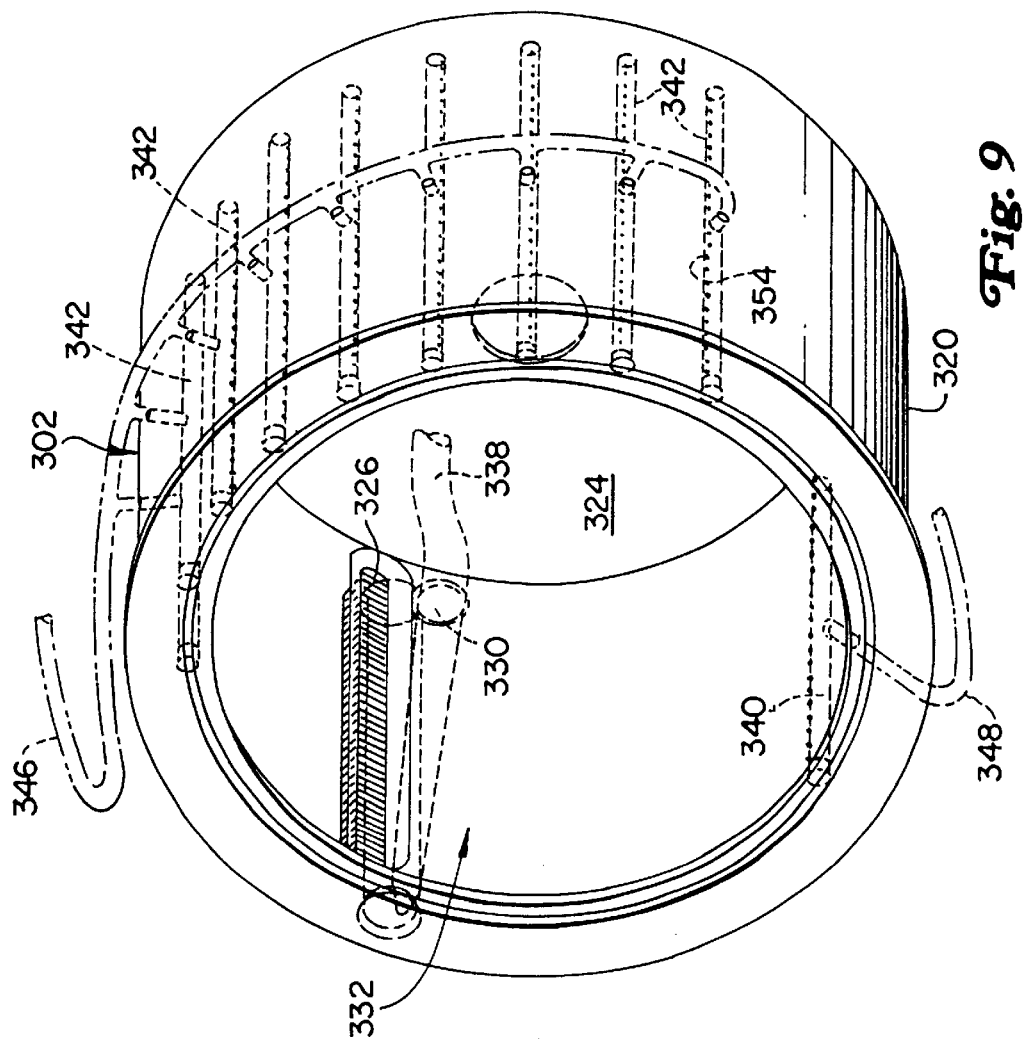
FIG. 9 is a perspective framework view of the process chamber shown in FIGS. 6 and 7.

Referring to FIGS. 7–10, a drain opening or slot 326 is provided in the cylindrical side wall 320 of the process chamber 302. The drain opening 326 is preferably horizontal and connects to a drain port 330 at the back end of the process chamber 302. Notches 328 are advantageously formed along the inside edge of the drain slot 326. A flexible drain line 338 runs from the drain port 330 to a system or facility drain or collection point, as shown in FIG. 9.

Referring to FIGS. 8 and 9, one or more lower manifolds 340 are provided near the bottom of the chamber 302. The bottom is the sector generally opposite (e.g., +/−45°) from the drain opening 326. An array of upper manifolds 342 are provided near the top of the chamber 302, and on the side of the chamber opposite from the drain slot 326. The manifolds 340 and 342 are supplied with liquid, vapor, or gas, by flexible supply lines 346 and 348 extending from the manifolds to supply sources. The manifolds have openings or nozzles 354, to apply or spray gas, vapor or liquid inwardly towards workpieces within the chamber 302. Depending on the processes to be performed, additional supply lines may be used. In addition, some of the manifolds 342 may provide a first fluid, such as water and process chemicals, whereas other manifolds 342 may provide another different fluid, such as nitrogen gas and or IPA vapor. The supply lines have sufficient slack or uptake loops, to allow the chamber 302 to pivot while maintaining fluid connection to the manifolds.

Figure 11:
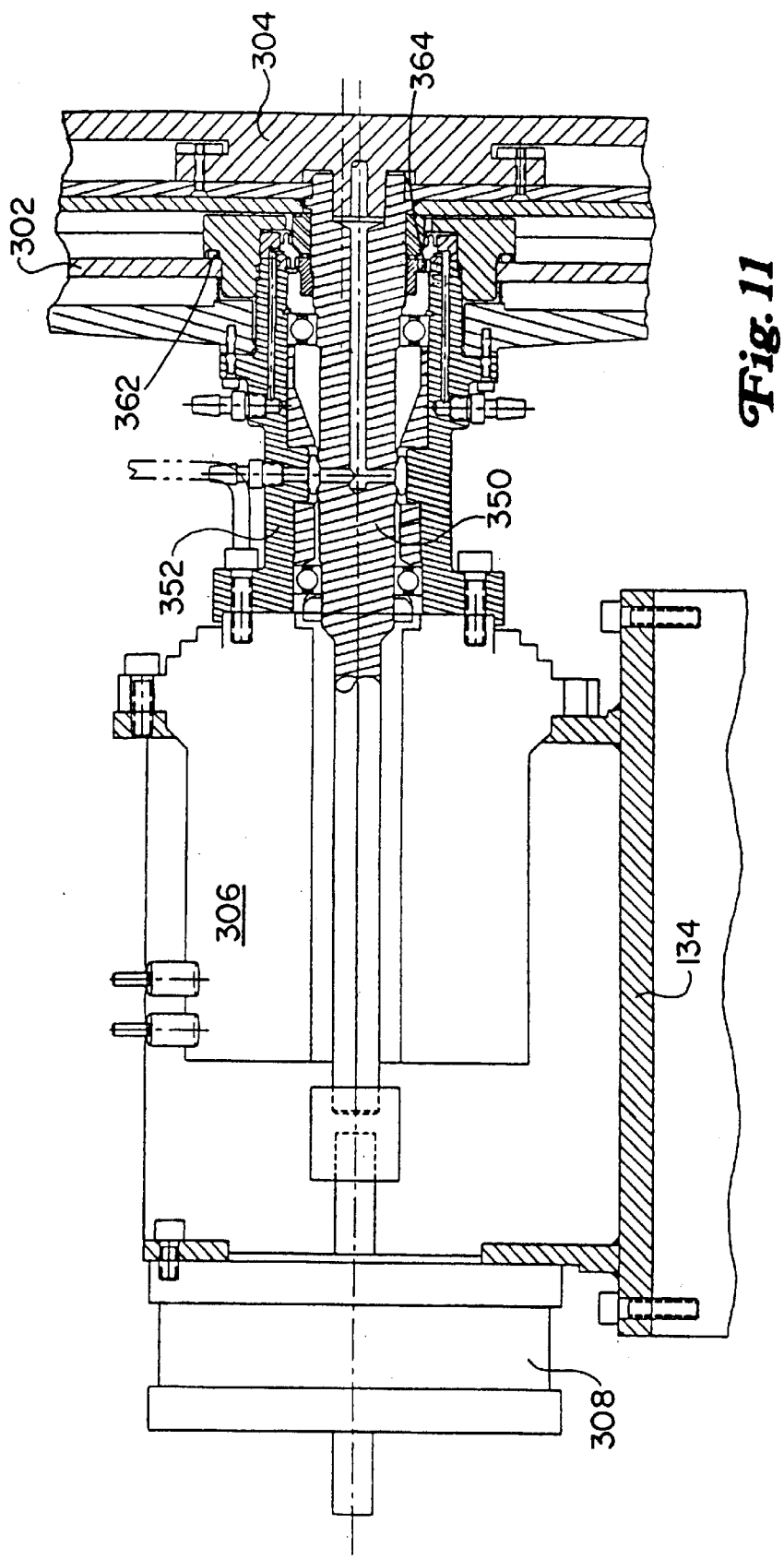
FIG. 11 is an enlarged partial section view of the back end of the processor unit shown in FIG. 6.

Turning to FIG. 11, a rotor shaft 350 extends from the spin motor 308 to the rotor 304. The rotor shaft 350 passes through a shaft opening 322 in the rear wall 324 of the chamber 302. Seals 362 and 364 are provided around the shaft opening 322, to prevent fluid leakage through the shaft opening 322. The rotor 304 is supported on the rotor shaft 350. A chamber collar 352 on the pivot motor 306 is joined to the rear wall 324 of the process chamber 302. The process chamber 302 is supported on, and pivots with, the chamber collar 352, driven by the pivot motor 306.

Figure 12:
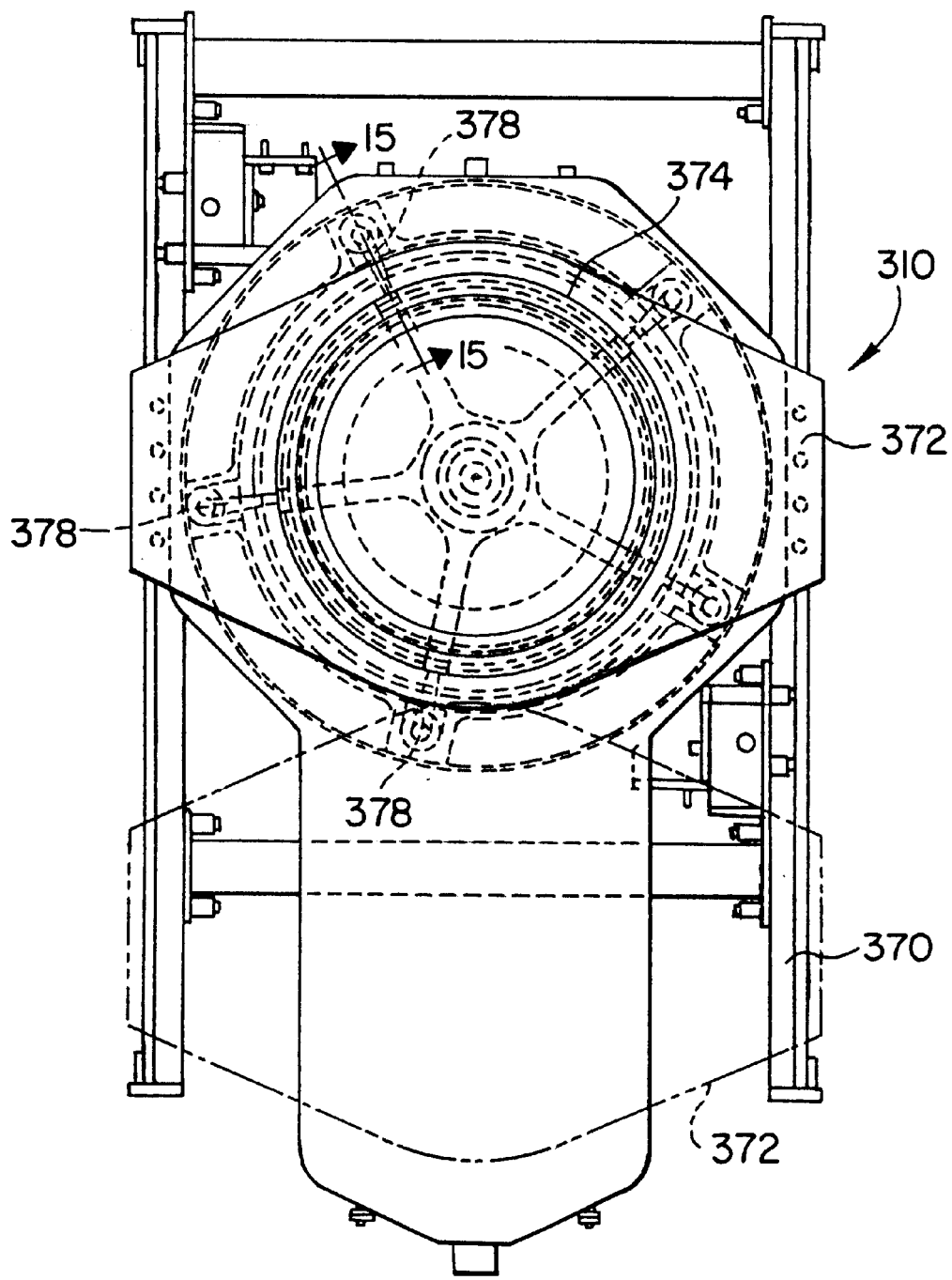
FIG. 12 is a front view of the door assembly shown in FIG. 6.
Figure 13:
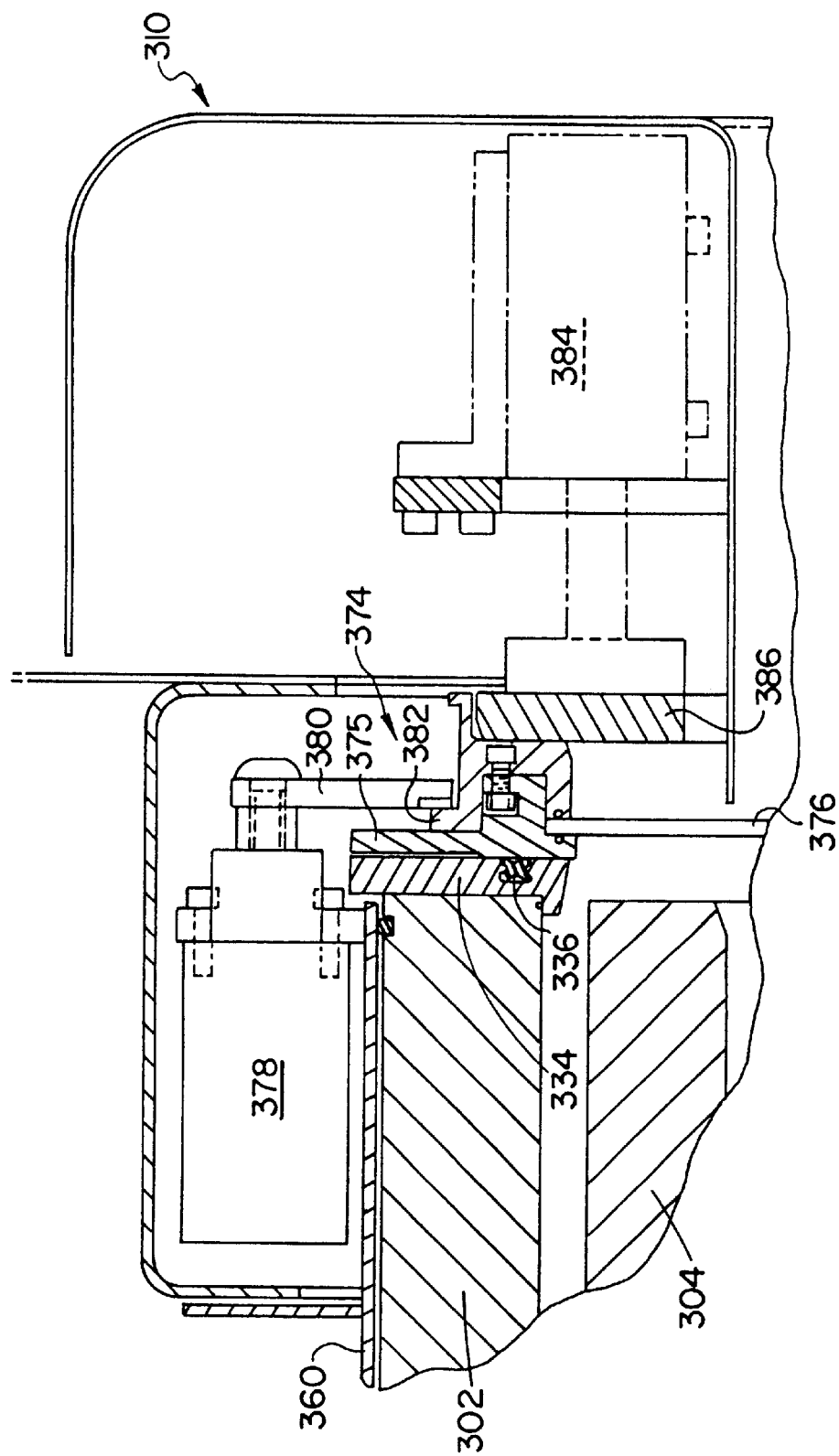
FIG. 13 is a partial section view of features of the door assembly shown in FIG. 12.

Turning to FIG. 12, the door assembly 310 moves vertically on door rails 370 from the up position, shown in solid lines, to the down position, shown in dotted lines. A door bridge 372 extending between the rails 371 supports the door assembly 310. Turning to FIG. 13, the door assembly 310 includes a round plate-like closure frame 374 including an annular door pad 375 attached to an annular door ring 382. A window 376 is secured between the pad 375 and the ring 382. With the door assembly 310 in the closed position, as shown in FIG. 27, the door pad 375 is clamped against the front flange plate 334 of the process chamber 302. A seal 336 in the flange plate 334 seals against the door pad 375.

Referring to FIGS. 12–15, swing actuators 378 are radially spaced apart around the circumference of the flange plate 334. A cam lever 380 on the swing actuator 378 is turned inwardly by the actuator 378 to clamp the door ring 382 and pad 375 against the flange plate 334 of the process chamber 302. The swing actuators 378 are mounted on the chamber support 360, which moves with the chamber 302.

Figure 14:
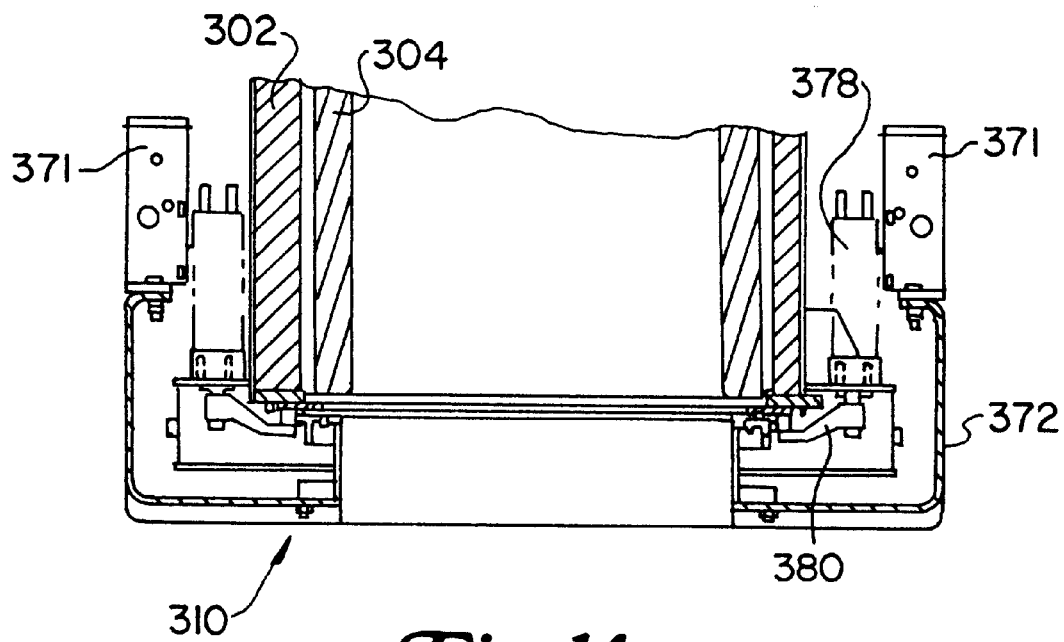
FIG. 14 is a top section view showing the door assembly of FIGS. 12 and 13 engaged with the process chamber.
Figure 15:
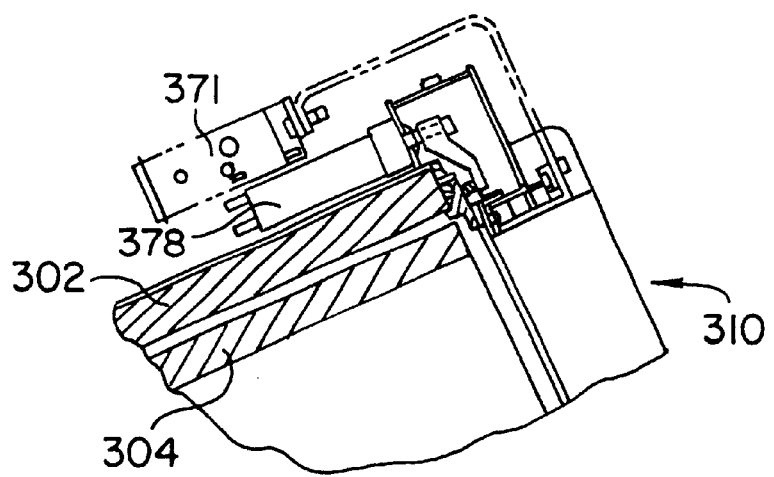
FIG. 15 is a section view taken along line 15—15 of FIG. 12.

Referring to FIG. 13, hand-off actuators 384 supported on the door bridge 372 have pickups 386. The actuators 384 move the pickups 386 to engage and hold the closure frame 374 during loading and unloading of workpieces into the process chamber 302. The pickups 386 are released and separated from the closure frame 374 during processing. Accordingly, the closure frame 374 can freely move with the process chamber 302, during processing. As shown in FIGS. 14 and 15, the door bridge 372 is connected to lift actuators 371, which move the door frame vertically between the up and down positions shown in FIG. 12.

The rotor 304 may have various forms. The rotor 304 may be any device which holds workpieces, and spins within the process chamber 302. FIGS. 16–19 show examples of rotors which may be used. Referring to FIG. 16, a rotor 400 has combs 402 for holding workpieces 60 directly. Retainers 404 are moved into engagement against the edges of the workpieces, to hold them in place within the rotor 400 by the process robot, as described in U.S. Pat. No. 5,664,337, incorporated herein by reference.

As shown in FIG. 17, an alternative rotor 410 is adapted to hold workpieces contained in trays, cassettes, or carriers. The trays 416, or cassettes or carriers 418 slide into a slot 412 and are held in place within the rotor, for example, by lips 414, as described in U.S. Pat. No. 5,544,421, incorporated herein by reference.

Figure 18:
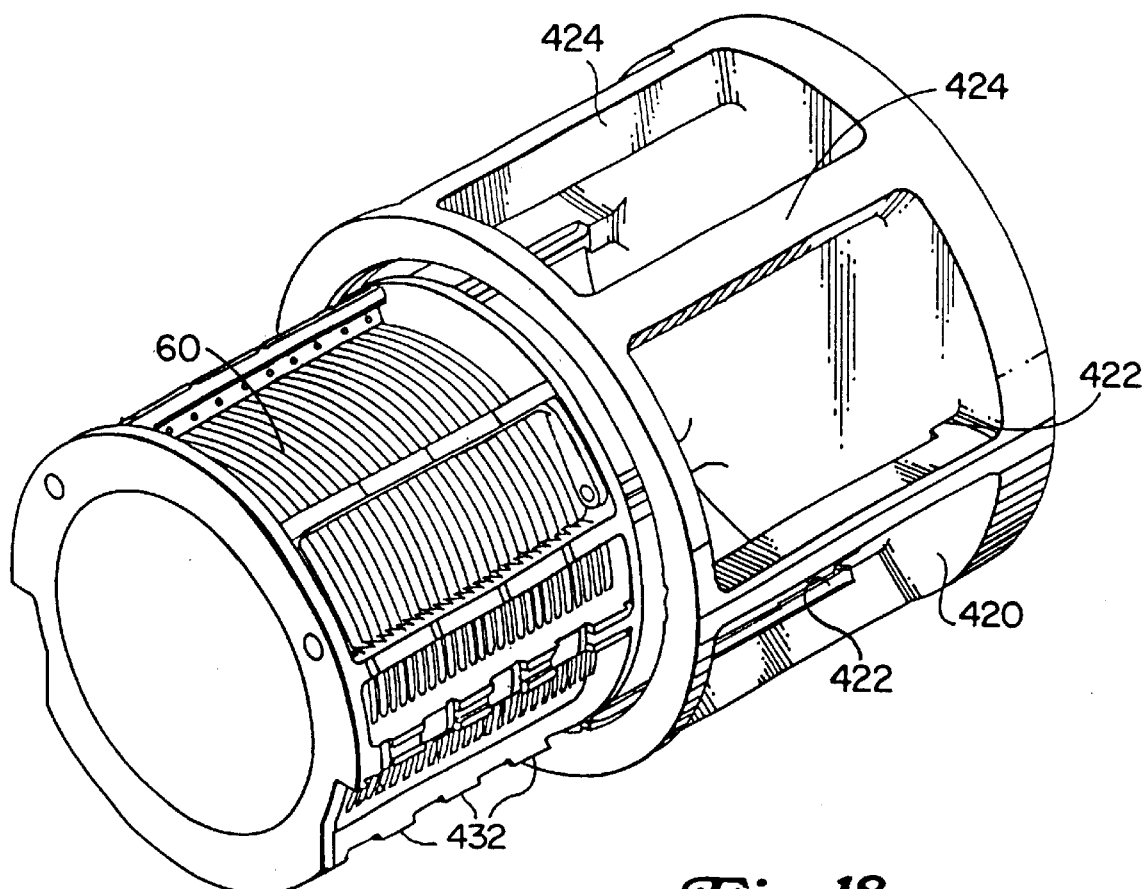
FIG. 18 is a perspective view of an alternative rotor and carrier.

As shown in FIG. 18, an alternative rotor 420 has steps 422 formed on ribs 424. The steps 422 are dimensioned to receive or mate with corresponding lugs 432 on a carrier 426, as described in U.S. patent application Ser. No. 09/735,154, incorporated herein by reference. FIG. 19 shows another carrier 440 which may be used with the rotor 420, with or without the lugs 432. The carrier 440 has slots 442 for receiving and holding workpieces 60. The workpieces 60 are loaded into the carrier 440 from an opening 444 in the side of the carrier.

The process chamber 302 described above may also be used with a fixed carrier support, in place of a rotor 304. In this design, the spin motor 308 and drive shaft 350 can be omitted, with the workpiece support supported on a central arm extending through the shaft opening 322 in the process chamber 302 and joined or supported by the chassis 134.

In use, the processor unit 300 operates as follows. Workpieces 60 are loaded into the rotor 304. This may be achieved manually, or via the process robot 22. The workpieces may be loaded directly into combs or slots in the rotor 304. Alternatively, the workpieces may be held in a tray, cassette or carrier, which in turn is loaded into the rotor 304.

Typically, several carriers, cassettes or trays of workpieces 60 will be loaded in, so that several, or all, of the available storage positions in the indexer 16 are occupied. The indexer 16 may have shuttle positions and movements, as shown in FIGS. 1 and 3. Alternatively, fixed or moving transfer carriages may be used, as described in U.S. Pat. No. 5,660,517, incorporated herein by reference. Carousel systems may also be used, as described in U.S. Pat. No. 5,664,337 or U.S. Pat. No. 6,447,232, incorporated herein by reference. The workpieces 60 may alternatively be provided into the system 10 within sealed containers or pods, as described in U.S. Pat. No. 6,447,232 or Ser. No. 09/612,009, incorporated herein by reference. If the workpieces 60 are provided within sealed pods, the pods may be handled, unsealed, and accessed as described in the patent applications referenced above.

The workpieces 60 are picked up by the process robot 22, and moved from the interface section 24 to the process section 26. The movement of the workpieces 60 from the indexer 16 or other storage location within the interface section 24 may be achieved as described in U.S. Pat. Nos. 6,447,232; 6,279.724 or Ser. No. 09/612,009. Process parameters and workpiece movement may be controlled by the computer/controller 32, or by the control panel 28, or by another remote or facility computer/controller.

During loading, the door bridge 372 is in the down position shown in dotted lines in FIG. 12. Consequently, the front end 332 of the process chamber 302 is open. The process chamber 302 is preferably in the upright or 0° position, as shown in FIG. 7, with the drain slot 326 at or near the top. The axis of rotation R of the rotor 304 is preferably horizontal. The pivot axis P of the process chamber 302, as shown in FIG. 6, is also preferably horizontal and may coincide with the axis R. The workpieces are preferably in a vertical or near vertical orientation.

The door bridge 372 is raised to the up position shown in solid lines in FIG. 12 by the door lifters 371. With the closure frame 374 aligned with the open front end 332 of the process chamber 302, the hand-off actuators 384 extend to move the closure frame 374 against the flange plate 334, as shown in FIG. 13. The swing actuators 378 then move the cam levers 380 inwardly. The cam levers 380 engage the door ring 382 of the closure frame 374, clamping the closure frame 374 against the flange plate 334. The hand-off actuators 384 then release the pickups 386 from the door ring 382 and retract. The closure frame 374 is now closing off, or sealing, the open front end 332 of the process chamber 302. In addition, the closure frame 374 is released or free from the rest of the door assembly 310, so that it can move with the process chamber 302, as the process chamber pivots.

Referring to FIG. 9, process liquids, gases, or vapors (collectively referred to as fluids) are sprayed or otherwise introduced into the process chamber via the supply lines 346 and 348. Referring momentarily to FIGS. 16–19, the rotor 304 advantageously has an open frame structure. This allows fluids from the manifolds 340 and 342 to be sprayed or otherwise applied through the rotor 304 and onto the workpieces 60. Depending on the specific process to be performed on the workpieces, the fluids used may include corrosives or caustics, solvents, vapor phase chemicals, acids, such as hydrofluoric acid, ozone, water, ozonated water and mixtures of them. As multiple fluids may be provided to different manifolds through multiple supply lines, various sequential processing steps may be carried out within the process chamber 302, without removing the workpieces from the chamber. As the chamber 302 encloses the workpieces, potential for external contamination of the workpieces is reduced. For sequential processing steps, different fluids may be applied to the workpieces by immersion, spraying, or other application. Cleaning may be performed in between the processing steps.

For immersion or rinsing steps, liquid is introduced into the process chamber 302, until the level of liquid rises high enough so that the workpieces are immersed. The workpieces may dwell in the bath of liquid for a predetermined amount of time. To remove the rinsing or immersion liquid, the pivot motor 306 is actuated, optionally via the controller/ computer 32. As the chamber 302 pivots, the drain slot or opening 326 moves down to the level of the liquid. Liquid runs into the drain slot 326, via gravity, and out through the drain port 330 and drain line 338. The pivot motor 306 continues to pivot the process chamber 302 until the drain slot 326 moves from position A to position B in FIG. 8. This allows all liquid within the process chamber 302 to be drained out through the drain slot and drain port 330, via gravity. As the process chamber 302 pivots, the supply lines 346 and 348 (and others if provided) move with the process chamber 302 via take-up loops provided for this purpose. In addition, the closure frame 374 closing or sealing off the front end 332 of the chamber 302 moves with the chamber. For more rapid liquid removal, or to remove liquid without changing the positions of the manifolds 340 and 342, a bottom switched drain 325 may also be provided in the cylindrical side wall 320 of the process chamber 302.

Preferably, the chamber is turned or pivoted so that the liquid drains out at a rate of about 0.1–30 or 0.1–10 or 0.1–5 or 0.1–2 mm/second, 0.5–10 or 0.5–5 or 0.5–1 or 2 mm/second. The drain or drop rate is selected to be as fast as practical, without having the meniscus separate from the workpiece surface.

For cleaning procedures, water is introduced into the process chamber 302 from the lower manifold 340 and/or the upper manifolds 342. The water may be sprayed onto the workpieces. Alternatively, the water may flow in through outlets without spraying. As the water level within the process chamber 302 rises, the workpieces are immersed and rinsed. Many of the manifolds 342 may be submerged in the liquid as the liquid level rises. Depending on the process, flow or spray from these manifolds may be turned off, or they may continue to deliver a liquid, gas or vapor into the bath of liquid in the chamber 302.

The workpieces are immersed in the cleaning liquid. Preferably, a continuously refreshed bath of liquid is provided into the chamber 302. The liquid is sprayed or pumped in via the lower manifold 340 or another inlet. The liquid preferably continuously drains out through the drain opening 326 through the entire liquid removal sequence, until the workpieces are no longer contacted by the bath of liquid. Sonic energy may be applied to the work pieces 60 via a transducer 333 on the chamber or the rotor. The transducer 333, such as a megasonic or ultrasonic transducer, is positioned to transmit sonic energy through liquid in the chamber 302, to the work pieces immersed in the liquid.

The process chamber 302 is pivoted (counterclockwise in FIGS. 7 and 8) to allow the rinse liquid to drain out through the drain slot 326, as described above. Before the level of the rinse liquid or water begins to drop, organic solvent vapor, such as IPA vapor, is introduced into the process chamber 302, above the liquid level, through one or more of the manifolds 342. The organic solvent vapor reduces the surface tension of the water at the workpiece surface/water interface. This reduces or prevents water droplets from remaining on the workpiece surfaces, as the water level drops, resulting in less contamination. This vapor assists in removing liquid from the workpiece. A gas such as nitrogen or air, may also be introduced into the process chamber 302, via one or more manifolds 342, or with the vapor. The gas may be heated. Additional solvent vapor and gas (if used) is provided as the process chamber 302 continues to pivot and the liquid level continues to drop. The vapor may be entrained in the gas. After the liquid drops entirely below the level of the workpieces, the vapor supply is shut off. Gas supply preferably continues to purge any remaining vapor from the chamber 302.

After most or all of the liquid has been drained out by pivoting the chamber, the spin motor 308, preferably under the control of the controller/computer 32, turns on, causing the rotor 304 to spin. The spinning movement of the workpieces within the rotor helps to remove any remaining droplets from the workpieces via centrifugal force. Gas may be sprayed onto the workpieces while they are spinning, helping to remove any remaining liquid from the workpieces. The process chamber pivots back to its original upright position, before or after spinning the workpieces.

After processing of the workpieces within the process chamber 302 is complete, the hand-off actuator 384 re-engages the closure frame 374 with the pickups 386. The swing actuators 378 move the cam levers outwardly and off of the door ring 382. The actuators 384 then pull the closure frame 374 away from the front end 332 of the process chamber 302. The door bridge 372 moves back to the down position. The workpieces are then removed from the process chamber 302. While described for use on batches of workpieces, the invention applies as well to single workpiece operations.

In an alternative design, the rotor shaft 350 is extended and may telescope axially outwardly via the motor 308 or another actuator, along the axis R to extend the rotor 304 out of the process chamber 302 to better facilitate loading and unloading.

Ordinarily, during immersion processing, when the process chamber 302 is largely filled with liquid, the rotor 304 will remain in position and not spin. However, for certain processes, the rotor 304 may spin at slow speed while the rotor 304 and workpieces 60 are immersed in liquid to agitate the liquid or improve the flow of liquid over the surfaces of the workpiece. The workpieces may alternatively be held at an inclined angle of e.g., 5–15 degrees from vertical in the rotor, to help avoid contact between workpieces during processing.

Thus, while several embodiments have been shown and described, various changes and substitutions may of course be made, without departing from the spirit and scope of the invention. The invention, therefore, should not be limited, except by the following claims, and their equivalents.

What is claimed is:

1. A system for processing a workpiece comprising:
   an interface section;
   a process section;
   a process robot moveable to carry a workpiece from the interface section to the process section;
   a processor unit in the process section, with the processor unit having a process chamber, a drain opening in the process chamber, and a process chamber driver for pivoting the process chamber to drain liquid out of the process chamber by moving the drain opening down to the level of the liquid in the process chamber.

2. The system of claim 1 where the process chamber has a curved sidewall and the drain opening is in the curved sidewall.

3. The system of claim 2 wherein the drain opening comprises a slot in the curved sidewall connecting to a drain port.

4. The system of claim 2 where the process chamber is generally cylindrical and has a central axis, and the process chamber driver pivots the process chamber about an axis parallel to the central axis of the generally cylindrical process chamber.

5. The system of claim 1 wherein the process chamber pivots about a horizontal axis.

6. The system of claim 1 further comprising at least one manifold in the process chamber for introducing a fluid into the process chamber.

7. The system of claim 1 where the process chamber driver pivots the process chamber from a first position where the drain opening is adjacent to the top of the process chamber, to a second position, where the drain outlet is adjacent to the bottom of the process chamber.

8. The system of claim 1 further comprising a rotor rotatably supported within the process chamber, with the rotor having positions for holding workpieces.

9. The system of claim 1 further comprising a door assembly including a closure frame attachable to the process chamber.

10. A system for processing a workpiece comprising:
    an interface section;
    a process section;
    a process robot moveable to carry a workpiece from the interface section to the process section;
    a processor unit in the process section, with the processor unit having a process chamber including:
    a drain opening in the process chamber;
    a process chamber driver for pivoting the process chamber to drain liquid out of the process chamber; and
    a rotor rotatably supported within the process chamber.

11. The system of claim 10 further comprising at least one manifold in the process chamber, and a flexible supply line joined to the manifold, with the flexible supply line moving with the process chamber as the process chamber pivots.

12. The system of claim 10 further comprising a switchable drain in the process chamber at a position spaced apart from the drain opening.

13. The system of claim 10 where the process chamber comprises a backwall joined to a cylindrical sidewall, and with the process chamber having an open front end, and further comprising door means for closing off the open front end of the process chamber.

14. The system of claim 1 further comprising a first manifold in the process chamber connected to a source of an organic solvent vapor, and a second manifold in the process chamber connected to a source of water.

15. The system of claim 1 where the process chamber is supported only by the process chamber driver.

16. The system of claim 10 further comprising a spin motor connected to the rotor.

17. A processor unit for processing a workpiece, comprising:
    a process chamber;
    a workpiece support in the process chamber;
    a drain opening in the process chamber; and
    a process chamber driver for pivoting the process chamber to move the drain opening from a first position to a second position relative liquid in the process chamber, to drain liquid out of the process chamber.

18. The processor of claim 17 where the workpiece support comprises a rotor rotatably positioned within the process chamber.

* * * * *